(12) United States Patent
Sharma et al.

(10) Patent No.: US 7,940,545 B2
(45) Date of Patent: May 10, 2011

(54) LOW POWER READ SCHEME FOR READ ONLY MEMORY (ROM)

(75) Inventors: Ashish Sharma, New Delhi (IN); Sanjeev Kumar Jain, Ghaziabad (IN); Manmohan Rana, New Delhi (IN)

(73) Assignee: Freescale Semiconductor, Inc., Austin, TX (US)

( * ) Notice: Subject to any disclaimer, the term of this patent is extended or adjusted under 35 U.S.C. 154(b) by 177 days.

(21) Appl. No.: 12/488,624

(22) Filed: Jun. 22, 2009

(65) Prior Publication Data
US 2009/0316464 A1 Dec. 24, 2009

(30) Foreign Application Priority Data
Jun. 24, 2008 (IN) .................. 1516/DEL/2008

(51) Int. Cl.
*G11C 17/00* (2006.01)
(52) U.S. Cl. .......... 365/94; 365/203; 365/227; 365/206; 365/210.1
(58) Field of Classification Search .......... 365/94, 365/203, 227, 206, 210.1
See application file for complete search history.

(56) References Cited

U.S. PATENT DOCUMENTS

| | | | | |
|---|---|---|---|---|
| 4,857,764 A * | 8/1989 | Young | ............... | 326/86 |
| 5,255,232 A * | 10/1993 | Foss et al. | ............... | 365/203 |
| 5,386,150 A * | 1/1995 | Yonemoto | ............... | 327/141 |
| 5,724,294 A * | 3/1998 | Khieu | ............... | 365/210.12 |
| 6,160,746 A * | 12/2000 | Park et al. | ............... | 365/203 |
| 6,226,754 B1 * | 5/2001 | Ware et al. | ............... | 713/400 |
| 7,002,827 B1 | 2/2006 | Sabharwal et al. | | |
| 7,023,759 B1 * | 4/2006 | Bunce et al. | ............... | 365/230.06 |
| 7,035,129 B1 | 4/2006 | Khanuja | | |
| 7,061,803 B2 * | 6/2006 | Kim | ............... | 365/185.17 |
| 7,215,587 B2 * | 5/2007 | Lee et al. | ............... | 365/200 |
| 7,755,949 B2 * | 7/2010 | Rengarajan et al. | ............... | 365/185.25 |
| 2008/0031054 A1 * | 2/2008 | Lehmann et al. | ............... | 365/189.02 |
| 2009/0316465 A1 * | 12/2009 | Jain et al. | ............... | 365/94 |
| 2010/0142303 A1 * | 6/2010 | Park et al. | ............... | 365/209 |

OTHER PUBLICATIONS

Edwin De Angel, Survey of Low Power Techniques for ROMS, Low Power Electronics and Design 1997, Proceedings., 1997 International Symposium, Aug. 18-20, 1997, p. 7-11.

* cited by examiner

*Primary Examiner* — Viet Q Nguyen
(74) *Attorney, Agent, or Firm* — Charles Bergere

(57) ABSTRACT

A ROM includes a ROM array, an address decoder, a control circuit, a precharge tracker, a precharge circuit, a reference word line, a reference bit line and a reference sense generator. The control circuit generates control signals for reading the ROM. The address decoder enables a bit line and a word line. The precharge tracker generates a programmable precharge signal, which is provided to the precharge circuit for precharging the enabled bit line. A reference word line is enabled based on the programmable precharge signal and the control signals for tracking the enabled word line. A reference bit line is enabled based on the reference word line for tracking the enabled bit line. The reference sense generator generates a programmable sense signal based on the reference bit line, the programmable precharge signal and the control signals for reading a bit cell corresponding to the enabled bit line and word line.

20 Claims, 8 Drawing Sheets

LOW POWER READ SCHEME FOR READ ONLY MEMORY (ROM)

BACKGROUND OF THE INVENTION

The present invention relates to Read Only Memories (ROMs). In particular, the present invention relates to a low power read scheme for a ROM.

A ROM includes bit line columns, each of which includes bit cells. The bit cells can store a logic 1 or logic 0. When a bit cell stores logic 1, a source terminal of the bit cell is open circuited and when the bit cell stores logic 0, the source terminal of the bit cell is connected to a source line. The source line and the bit line are initially maintained at a voltage $V_{DD}$, which is at logic 1. Hence, in a standby mode the ROM dissipates power. For example, in current read schemes the standby power dissipation is generally around 0.25 milli Amperes.

For a read operation, a bit line and word lines corresponding to the bit cell are selected. Thereafter, a source line corresponding to the selected bit line is pulled down to an approximately zero voltage ($V_{SS}$). The bit line is pulled down to $V_{SS}$ if the bit cell stores a logic 0. However, the bit line is maintained at $V_{DD}$ if the bit cell stores a logic 1. After the read operation is complete, the bit line as well as the source line needs to be pulled up to the standby mode, i.e., $V_{DD}$. In the active mode for a read 0 operation, the bit line needs to be discharged to $V_{SS}$ and thereafter, needs to be pulled back up to $V_{DD}$. Hence, for a read 0, power is dissipated in the active mode. For example, in current read schemes the active power dissipation is generally on the order of milli Amperes. Further, pulling up and pulling down of the bit line voltage requires connecting additional circuitry to the bit line.

Advances in ROM technology have led to the development and use of 45 nanometer (nm) technology. However, ROMs used in 45 nm technology or below suffer from high leakage power. This leads to leakage such as sub-threshold leakage, junction leakage and gate leakage. The sub-threshold leakage is proportional to a drain source voltage ($V_{ds}$). The junction leakage and the gate leakage are proportional to a drain voltage ($V_{db}$), a source voltage ($V_{sb}$), a gate source voltage ($V_{gs}$) and a gate drain voltage ($V_{gd}$).

ROMs generally use only logic delays for performing sense and read operations. The logic delays are provided by internal clocks and are generated within the ROM circuitry. However, logic delays do not provide sufficient accuracy for tracking variations in Resistance (R) and Capacitance (C) of bit lines in order to comply with six sigma variations especially for 45 nm technology or below. Further, the logic delays are not efficient for controlling the precharge pulse width, e.g., when there is a mismatch in the precharge tracker rate and the actual precharge rate, tracking of the bit line is not accurate.

Further, the logic delays are not accurate in when there are long paths with a large Resistance Capacitance (RC) component such as the line from the clock to the word line generation circuit. Hence, tracking of the word line is not accurate. Moreover, the logic delays are not sufficient to prevent unnecessary toggling at the sense amplifier while placing the read data on the global Input/Output (I/O) lines.

It would be advantageous to have a ROM that does not suffer from high leakage power and also allows for accurate tracking of R and C variations in bit lines and word lines.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
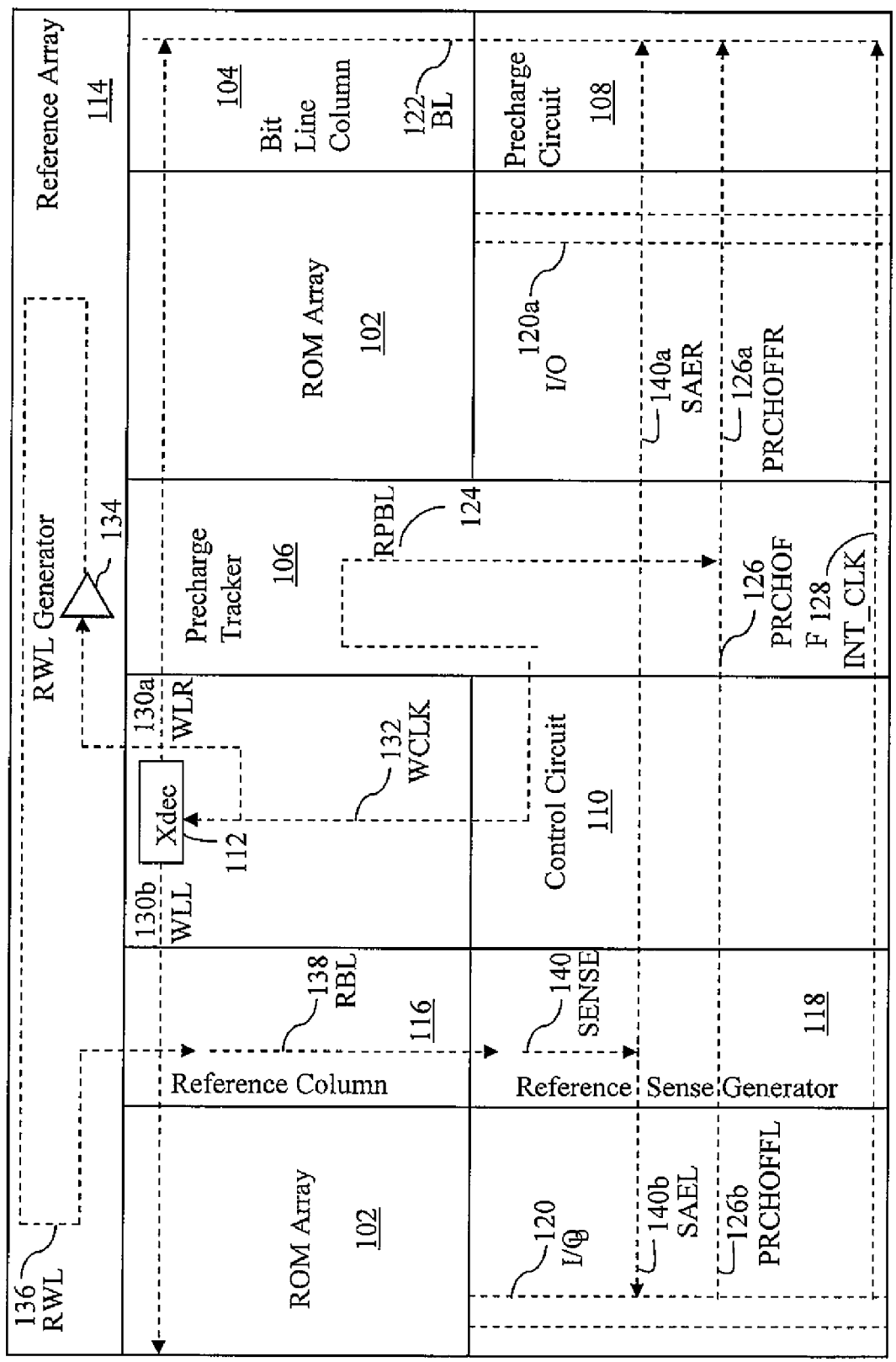
FIG. 1 is a block diagram of a ROM that can perform a low power read scheme, in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a Read Only Memory (ROM) is provided. The ROM includes a ROM array, an address decoder, a control circuit, a precharge tracker, a precharge circuit, a reference word line, a reference bit line, and a reference sense generator. The ROM array includes a plurality of bit lines columns that are connected to a plurality of bit lines. Each of the plurality of bit line columns includes a plurality of bit cells. Further, gate terminals of the each of the plurality of bit cells are connected to a plurality of word lines. The address decoder enables at least one of the bit lines and at least one of the word lines for a read operation. Further, the control circuit generates at least one control signal. Thereafter, the precharge tracker generates a programmable precharge signal by tracking a precharge of a reference precharge bit line. The precharge circuit is connected to the enabled bit line for precharging the enabled bit line. The enabled bit line is precharged based on at least one of the programmable precharge signal and the at least one control signal. The reference word line is enabled with a reference array based on at least one of the programmable precharge signal and the at least one control signal. Further, the reference bit line is enabled using a reference column based on at least one of the reference word line and the at least one control signal. The reference bit line tracks the enabled bit line. The reference sense generator generates a programmable sense signal based on at least one of the reference bitline, the programmable precharge signal and the at least one control signal. The programmable sense signal is provided to a control logic circuit that is associated with the bit line for reading at least one bit cell corresponding to the enabled bit line and the at least one enabled word line.

In another embodiment, a method for reading a ROM array is provided. The ROM array includes a plurality of bit line columns that are connected to a plurality of bit lines. Each of the plurality of bit line columns includes a plurality of bit cells. Further, gate terminals of each of the plurality of bit cells are connected to a plurality of word lines. One of the plurality of bit lines and at least one of the word lines are enabled for a read operation. Thereafter, at least one control signal is generated. A programmable precharge signal tracks precharge of a reference precharge bit line. The enabled bit line is precharged based on at least one of the programmable precharge signal and the at least one control signal. Thereafter, a reference word line is enabled based on at least one of the programmable precharge signal and the at least one control signal. The reference word line tracks the at least one enabled word line. Further, a reference bit line is enabled based on at least one of the reference word line and the at least one control signal. The reference bit line tracks the enabled bit line. Furthermore, a programmable sense signal is generated based on at least one of the reference bit line, the programmable precharge signal and the at least one control signal. Thereafter, at least one bit cell is read corresponding to the enabled bit line and the at least one enabled word line based on the programmable sense signal.

In yet another embodiment, a system for precharging a ROM array is provided. The ROM array includes a plurality of bit line columns such that the plurality of bit line columns are connected to a plurality of bit lines. Each of the plurality of bit lines columns include a plurality of bit cells. Further, gate terminals of each of the plurality of bit cells are connected to a plurality of word lines. The system includes an address decoder, a control circuit, a precharge tracker, and a precharge circuit. The address decoder enables at least one of the word lines for a read operation. The control circuit generates at least one control signal for precharging the ROM array. Further, the precharge tracker generates a programmable precharge signal by tracking precharge of a reference precharge bit line. The precharge circuit is connected to the enabled bit line for precharging the enabled bit line based on at least one of the programmable precharge signal and the at least one control signal.

Embodiments of the present invention provide an ultra low power read scheme for a ROM. In the standby mode, the source line and the bit line of the ROM are maintained at approximately zero voltage ($V_{SS}$). Hence, power dissipation in the standby mode is reduced. Further, the source line is maintained at $V_{SS}$ for storing a logic 0. This prevents switching of the source line during a read 0 operation between $V_{SS}$ and $V_{DD}$. Hence, power dissipation in the active mode is reduced and no additional circuitry is required for switching of the source line. Further, sub-threshold leakage, junction leakage and gate leakage are reduced. The present invention also provides programmable delays in the ROM for compliance with six sigma variations and controlling the precharge pulse width. The programmable delays also prevent unnecessary toggling at the sense amplifier. The present invention also tracks RC variations in the bit line and the word line.

To describe the present invention, reference will be made to a ROM, although it is understood that the present invention can be implemented with any other suitable memory device such as a Random Access Memory (RAM).

Referring now to FIG. 1, a block diagram of a ROM 100 on which a low power read scheme may be performed is shown, in accordance with an embodiment of the present invention. The ROM 100 includes a ROM array 102, a bit line column 104, a precharge tracker 106, a precharge circuit 108, a control circuit 110, a row decoder (XDec) 112, a reference array 114, a reference column 116, and a reference sense generator 118.

The ROM array 102 includes Input/Output (I/O) lines 120a and 120b. A portion of the ROM array 102 is referred to as the bit line column 104. The bit line column 104 includes a bit line (BL) 122. The precharge tracker 106 includes a Reference Precharge Bit Line (RPBL) 124 and a Precharge Off (PRCHOFF) line 126. The precharge off line 126 includes a Precharge Off Right (PRCHOFFR) line 126a and a Precharge Off Left (PRCHOFFL) line 126b. The control circuit 110 includes an Internal Clock (INT_CLK) line 128. The XDec 112 includes a Word Line Right (WLR) line 130a, a Word Line Left (WLL) line 130b and a Word line Clock (WCLK) line 132. The reference array 114 includes a Reference Word Line (RWL) generator 134 and an RWL 136. The reference column 116 includes a Reference Bit Line (RBL) 138. The reference sense generator 118 includes a sense (SENSE) line 140. The SENSE line 140 includes a Sense Amplifier Enable Right (SAER) line 140a and a Sense Amplifier Enable Left (SAEL) line 140b.

The ROM array 102 includes a plurality of bit line columns such as the bit line column 104. Each bit line column includes bit cells wherein gate terminals of each of the bit cells are connected to word lines. The operation of the bit line column 104 is explained in detail in conjunction with FIG. 4. An address decoder enables a bit line such as the bit line 122 and a word line for reading a bit cell. In one embodiment, multiple word lines are enabled for reading multiple bit cells. In another embodiment, multiple bit lines are enabled for reading multiple bit cells such as in multi-port ROMs.

The control circuit 110 generates a control signal such as a signal on the INT_CLK line 128. The signal on the INT_CLK line 128 is provided to the precharge tracker 106 and generates a reference precharge signal on the RPBL 124. The operation of the precharge tracker 106 is explained in detail in conjunction with FIGS. 2 and 3. The reference precharge signal generates a programmable precharge signal such as a signal on the PRCHOFFR line 126a. The programmable precharge signal tracks precharging of the RPBL 124. The generation of the programmable precharge signal indicates the start of the precharging of the bit line 122. Further, the programmable precharge signal is also provided to the precharge circuit 108.

The precharge circuit 108 is connected to the bit line 122. The precharge circuit 108 precharges the bit line 122 based on the programmable precharge signal and control signals such as the signal on the INT_CLK line 128. The operation of the precharge circuit 108 is explained in detail in conjunction with FIG. 4.

When the precharging of the bit line 122 is complete, a signal on the WCLK line 132 is generated by the precharge tracker 106. It is to be noted that the precharging level depends on the criteria selected for a robust read 1 voltage margin. The signal on the WCLK line 132 is provided to the XDec 112. The XDec 112 generates signals on the WLR line 130a and the WLL line 130b. The signal on the WCLK line 132 is also provided to the RWL generator 134, which generates a signal on the RWL 136. The RWL 136 is enabled with the reference array 114 based on the programmable precharge signal and control signals such as the signal on the INT_CLK line 128. The operation of the reference array 114 is explained in detail in conjunction with FIG. 5. The RWL 136 tracks the enabled word line.

The signal on the RWL 136 is provided to the reference column 116, which generates a signal on the RBL 138. The operation of the reference column 116 is explained in detail in conjunction with FIGS. 6A and 6B. The RBL 138 is enabled using the reference column 116 based on the RWL 136 and control signals such as the signal on the INT_CLK line 128. The RBL 138 tracks the bit line 122.

The signal on the RBL 138 is provided to the reference sense generator 118, which generates a programmable sense signal on the SENSE line 140. The operation of the reference sense generator 118 is explained in detail in conjunction with FIG. 7. The programmable sense signal is generated using the RBL 138, the programmable precharge signal and control signals such as the signal on the INT_CLK line 128. The programmable sense signal provides signals on the SAER line 140a and the SAEL line 140b. The programmable sense signal is also provided to control logic associated with the bit line 122 for reading the bit cell corresponding to the bit line 122 and the enabled word line. The signals on the SAER line 140a and the SAEL line 140b are used for placing the read data on the I/O lines 120a and 120b.

In one embodiment, the ROM 100 is a part of a ROM compiler. Further, the ROM 100 may be developed using 45 nm technology or any other suitable technology. The ROM 100 may be used in applications such as wireless systems and memory devices.

Figure 2:
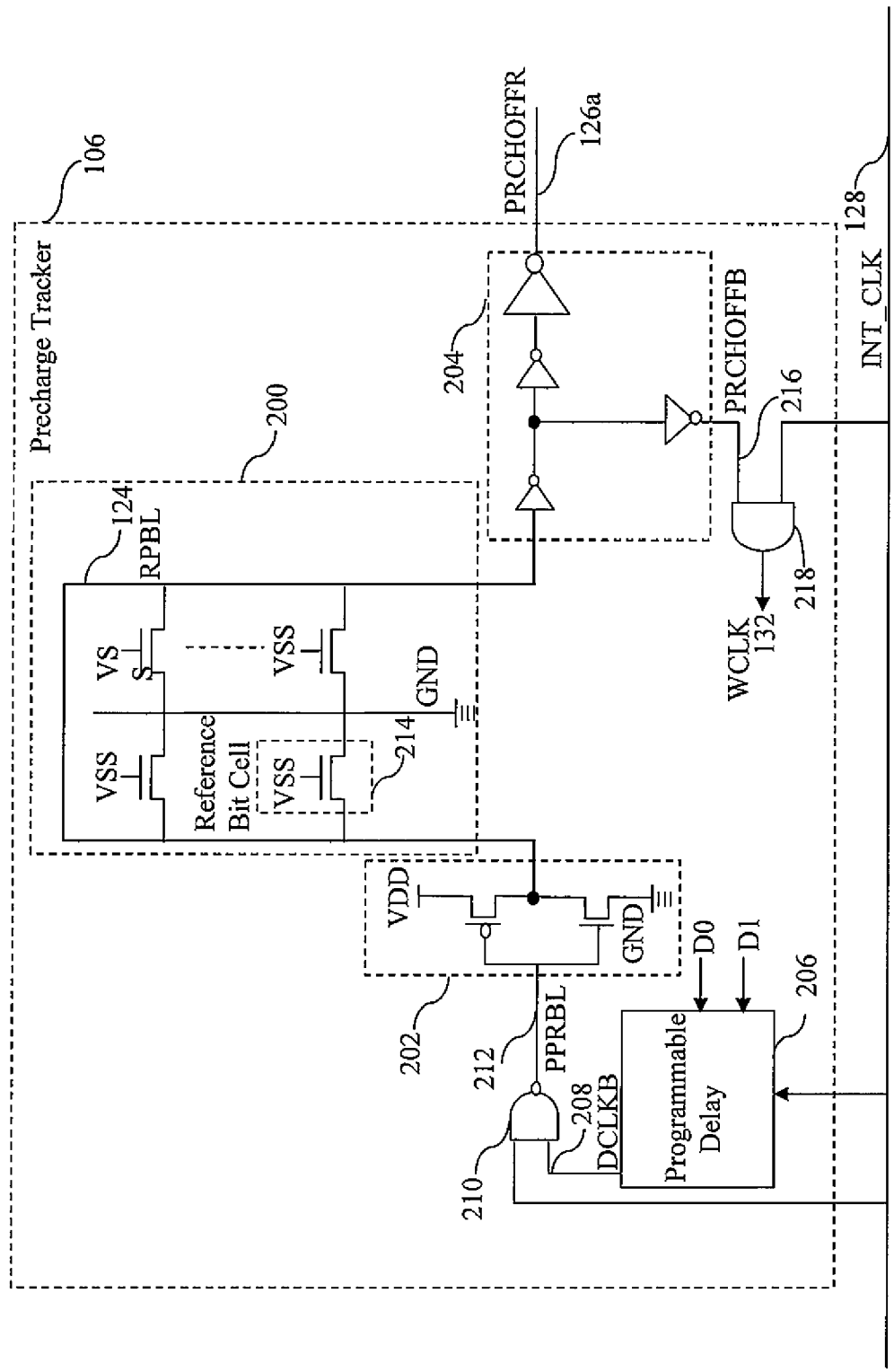
FIG. 2 is a circuit diagram of a precharge tracker, in accordance with an embodiment of the present invention.

Referring now to FIG. 2, a circuit diagram of the precharge tracker 106 is shown, in accordance with an embodiment of the present invention. The precharge tracker 106 includes a RPBL column 200, a reference precharge circuit 202, an inverter 204, a programmable delay circuit 206, a Delay Clock (DCLKB) line 208, a NAND gate 210, a Pre-Precharge Bit Line (PPRBL) 212, a programmable bit cell 214, a PRCHOFFB line 216 and an AND gate 218.

The RPBL column 200 includes the RPBL 124 and reference bit cells such as a reference bit cell 214. The reference precharge circuit 202 includes transistors. In an embodiment, the reference precharge circuit 202 includes logic gates. The inverter 204 includes NOT logic gates.

The signal on the INT_CLK line 128 is provided to the programmable delay circuit 206 along with control signals such as control signals D0 and D1. In one embodiment, the signal on the INT_CLK line 128 and the control signals D0-D1 are generated by the control circuit 110 (FIG. 1). In another embodiment, multiple signals such as the control signals D0 and D1 are provided to the programmable delay circuit 206. The programmable delay circuit 206 generates an output a signal on the DCLKB line 208.

The signal on the DCLKB line 208 is provided to the NAND gate 210 along with the signal on the INT_CLK line 128. The NAND gate 208 outputs a signal on the PPRBL 212. The signal on the PPRBL line 212 is provided to the reference precharge circuit 202, which outputs the reference precharge signal on the RPBL 124.

The number of reference bit cells in the RPBL column 200 is equal in number to the number of bit cells connected to the bit line 122. Further, the RPBL 124 has the same loading as the bit line 122 and hence represents the precharging of the bit line 122. The RPBL column 200 tracks the bit line column 104, which ensures tracking of variations in the bit line 122 during the precharging such as RC variations.

For example, if Resistance or Capacitance (RC) values of the bit line 122 vary during precharging then RC values of the RPBL 124 will also vary. Hence, any variations in the RC values of the bit line 122 are tracked by the precharge tracker 106 using the RPBL 124. Hence, the RPBL 124 is used for tracking the precharging of the bit line 122. In one embodiment, the programmable delay circuit 206 adjusts the width of the programmable precharge signal to account for the variations in the RC values of the bit line 122. The width is adjusted using the control signals D0 and D1 and the programmable delay circuit 206. The variations may cause the RPBL 124 to precharge at a faster rate than the bit line 122. In this embodiment, the width of the programmable precharge signal is decreased to account for such RC variations.

The reference precharge signal has the same loading as the bit line 122 however, the reference precharge signal is returned after covering half the path length as compared to the bit line 122. This arrangement of the RPBL column 200 is referred to as a return half way or a fifty percent loopback. Thereafter, the reference precharge signal is provided to the inverter 204.

The inverter 204 generates the programmable precharge signal. The inverter 204 also generates a signal on the PRCHOFFB line 216, which is provided to the AND gate 218 along with the signal on the INT_CLK line 128. The AND gate 218 outputs a signal on the WCLK line 132. The programmable precharge signal is provided to the precharge circuit 108. The programmable precharge signal is generated until the bit line 122 is precharged to approximately ninety five percent of drain voltage ($V_{DD}$). The programmable precharge signal is used to control the precharging of the bit line 122 by tracking precharging of the RPBL 124.

During precharge, the programmable precharge signal is at logic 1 and the signal on the PRCHOFFB line 216 is at logic 0. Thus, the programmable precharge signal is an inversion of the signal on the PRCHOFFB line 216. Since, the signal on the PRCHOFFB line 216 is at logic 0. The output of the AND gate 218 is at logic 0. Hence, the signal on the WCLK line 132 is low or disabled. The signal on the WCLK line 132 will be generated when the programmable precharge signal goes to logic 0 i.e., when precharge is complete. The signal on the WCLK line 132 is provided to the XDec 112.

Figure 3:
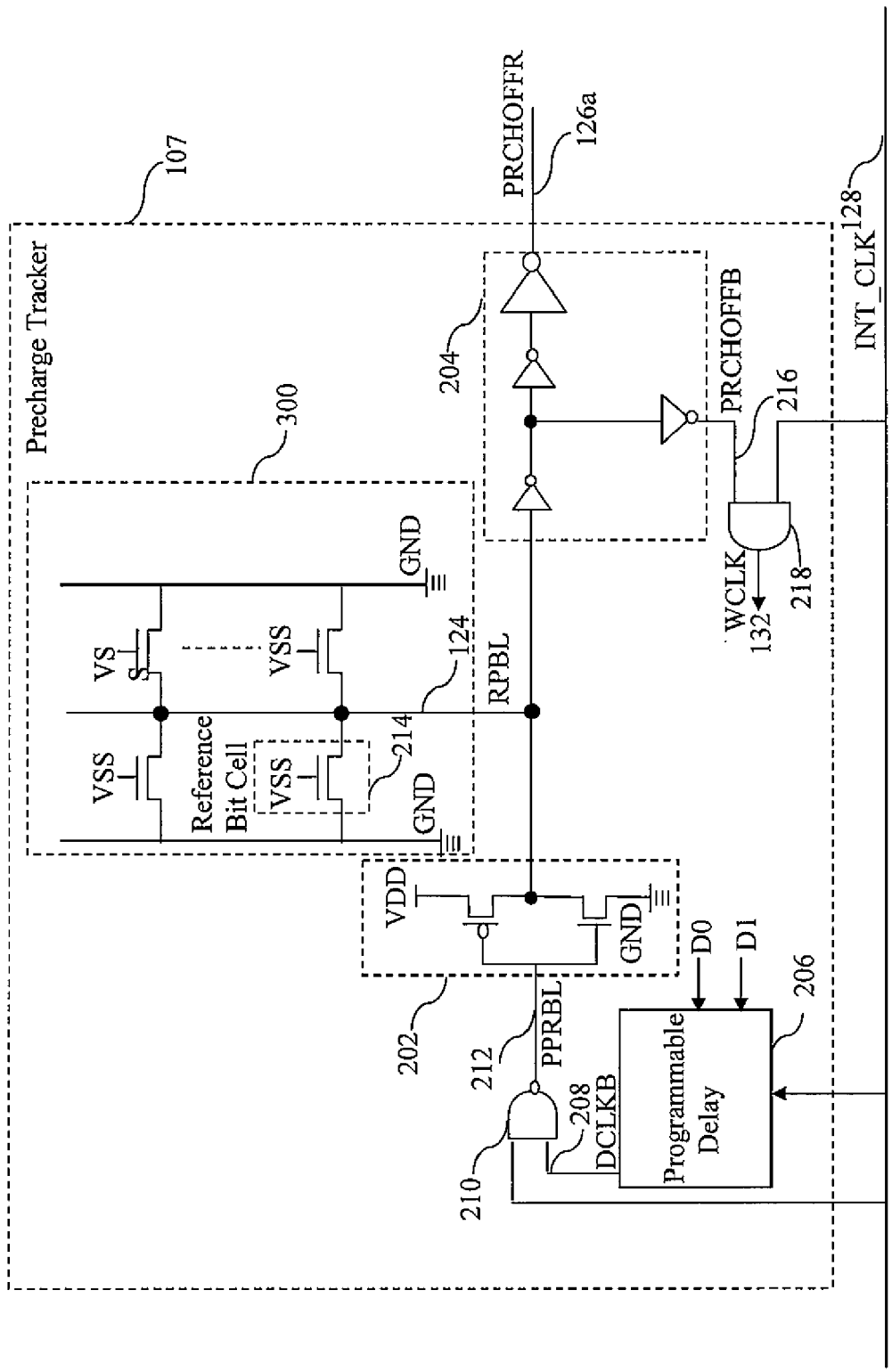
FIG. 3 is a circuit diagram of a precharge tracker, in accordance with another embodiment of the present invention.

Referring now to FIG. 3, a circuit diagram of a precharge tracker 107 in accordance with another embodiment of the present invention is shown. The precharge tracker 107 is similar to the precharge tracker 106 and includes the reference precharge circuit 202, the inverter 204, the programmable delay circuit 206, the Delay Clock (DCLKB) line 208, the NAND gate 210, the PPRBL 212, the programmable bit cell 214, the PRCHOFFB line 216, the AND gate 218, and an RPBL column 300.

The RPBL column 300 includes the RPBL 124 and reference bit cells, one of which is shown, the reference bit cell 314. However, the connection of the reference precharge circuit 202 to the RPBL column 300 and the inverter 204 is different from that shown in FIG. 2. In this embodiment, the reference precharge circuit 202 is directly connected to the inverter 204. Loading of the RPBL column 300 is the same as that of the bit line column 104. Hence, the RPBL column 300 tracks the bit line column 104, which ensures tracking of variations in the bit line 122 during precharging such as C variations. Further, the RPBL column 300 occupies less area in a memory device, such as the ROM 100, as compared to the RPBL column 200.

Figure 4:
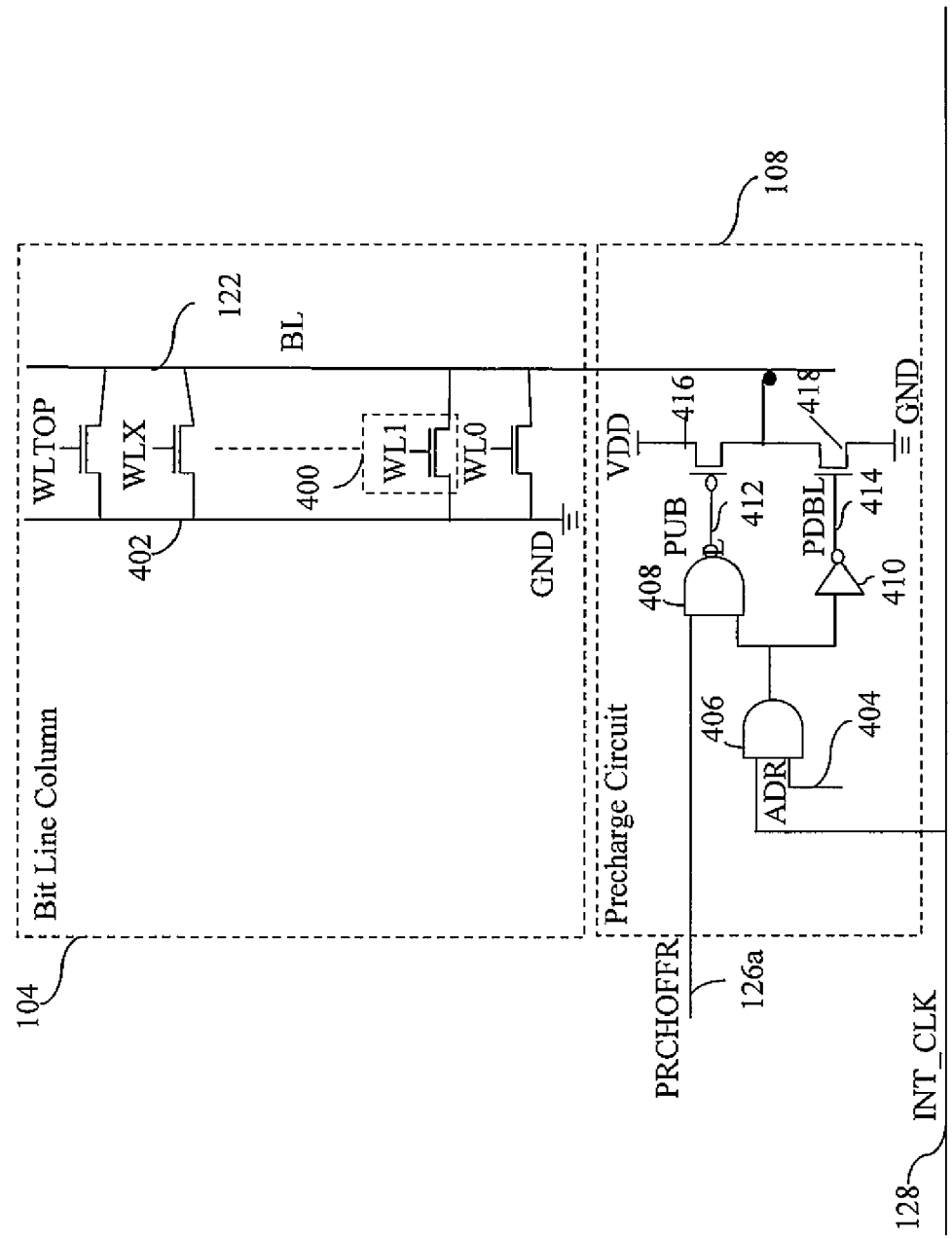
FIG. 4 is a circuit diagram of a bit line column and a precharge circuit, in accordance with an embodiment of the present invention.

Referring now to FIG. 4, a circuit diagram of the bit line column 104 and the precharge circuit 108 in accordance with an embodiment of the present invention is shown.

The bit line column 104 includes the bit line 122, and bit cells such as a bit cell 400 and a source line 402. The precharge circuit 108 includes an address (ADR) line 404, an AND gate 406, a NAND gate 408, a NOT gate 410, a Precharge Up Bit Line (PUBL) 412, a Precharge Down Bit Line (PDBL) 414 and a pair of transistors 416 and 418.

Drain terminals of each of the bit cells are connected to the bit line 122, which is initially discharged to a voltage $V_{SS}$. In the standby mode, the source line is also connected to $V_{SS}$.

Hence, in the standby mode the terminals of the bit line column 104 are at $V_{SS}$. In one embodiment, $V_{SS}$ is approximately equal to a ground voltage. Hence, the ROM 100 dissipates very little power in the standby mode. For example, standby power of the ROM 100 is in the Pico Ampere range. Further, gate terminals of each of the bit cells are connected to Word Lines (WLs) such as a WL0 line, a WL1 line and a WLTOP line. The source terminals of each of the bit cells are connected to the source line 402 for storing a logic 0 value. However, the source terminals are open circuited for storing a logic 1 value. Further, the source line 402 is connected to a ground voltage. Hence, the bit cells are connected to a ground voltage in the read 0 operation. This ensures that the ROM array 102 dissipates very little power in the active mode of the read 0 operation.

The signal on the INT_CLK line 128 and a signal on the ADR line 404 are provided to the AND gate 406. In one embodiment, the signal on the INT_CLK line 128 is generated by the control circuit 110. The signal on the ADR line 404 specifies a bit line, such as the bit line 122 that needs to be enabled in the ROM array 102 for the read operation. In one embodiment, the signal on the ADR line 404 is generated by the address decoder of the ROM 100.

When the output of the AND gate 406 is at logic 1 (for the read operation) and the programmable precharge signal is at logic 1, then the NAND gate 408 outputs a logic 0 on the PUBL 412. The signal on the PUBL 412 is inverted and then provided to the bit line 122 using the pair of transistors 416 and 418. Hence, a logic 1 is provided on the bit line 122 and the precharging is initiated.

The bit line 122 is precharged towards voltage $V_{DD}$. As previously discussed, the precharge level depends on the criteria selected for a robust read 1 voltage margin. The bit line 122 is precharged towards voltage ($V_{DD}$) when the PUBL 412 is about twenty percent charged. However, when precharging of the bit line 122 has reached the desired voltage level of $V_{DD}$, the programmable precharge signal goes to logic 0. This is achieved by the tracking provided by an RPBL column such as the RPBL column 200 and the RPBL column 300. The RPBL column indicates completion of the precharging by providing a logic 1 on the PDBL 414. The bit line 122 is discharged for sensing a logic 0 and is maintained at $V_{DD}$ for sensing a logic 1. The sensing of the bit line 122 is explained in more detail in conjunction with FIG. 7.

Figure 5:
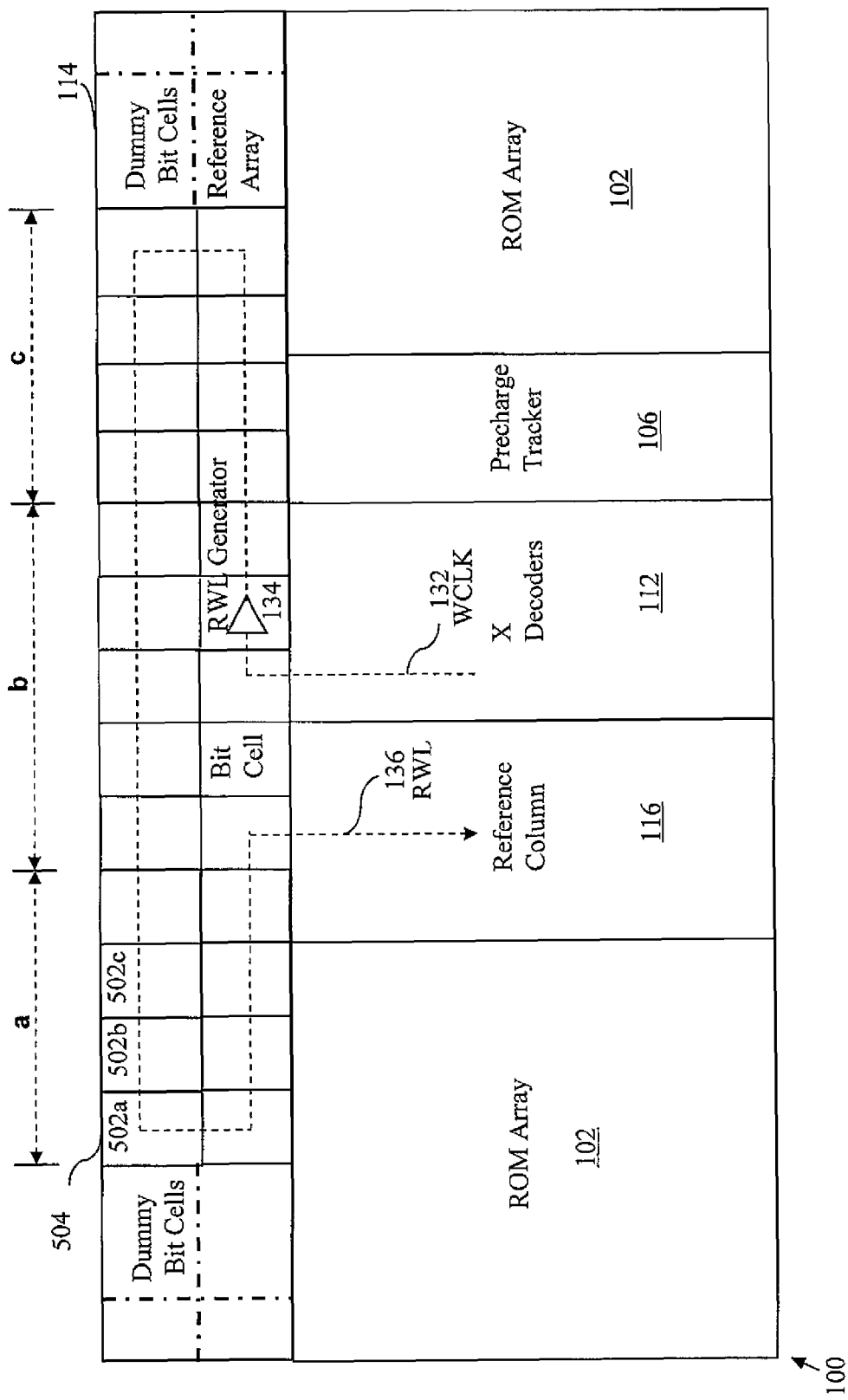
FIG. 5 is a block diagram of a reference array, in accordance with an embodiment of the present invention.

Referring now to FIG. 5, a block diagram of the reference array 114 in accordance with an embodiment of the present invention is shown. The reference array 114 includes the WCLK line 132, the RWL generator 134, the RWL 136, dummy bit cells 502a-502c, and dummy bit cell column 504. In one embodiment, the number of dummy bit cells, such as the dummy bit cells 502a-502c, is variable and can be increased or decreased as desired according to requirements of the ROM 100.

The signal on the WCLK line 132 is generated when precharging of the bit line 122 is complete. The signal on the WCLK line 132 is provided to the RWL generator 134, which generates the signal on the RWL 136. The signal on the RWL 136 is provided to the reference column 116, which ensures that RC variations on the WLR line 130a and the WLL line 130b are tracked. The reference array 114 includes the dummy bit cells 502a-502c. The number of columns such as the dummy bit cell column 504 is related to the number of dummy bit cells using the following equation:

Number of columns on one side of the ROM 100

$$=2a+b+2c \qquad \text{eq (1)}$$

Wherein, a, b and c are illustrated in FIG. 5.

Figure 6B:
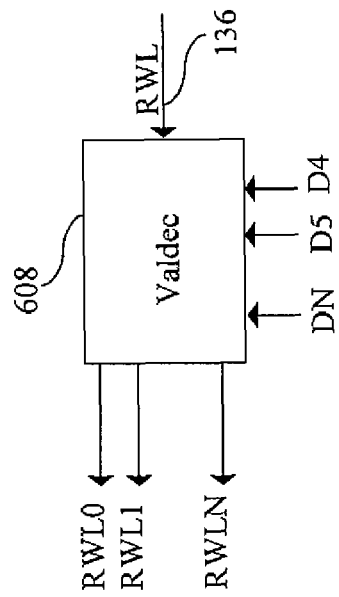
FIG. 6B is a block diagram of a decoding circuit, in accordance with an embodiment of the present invention.
Figure 6A:
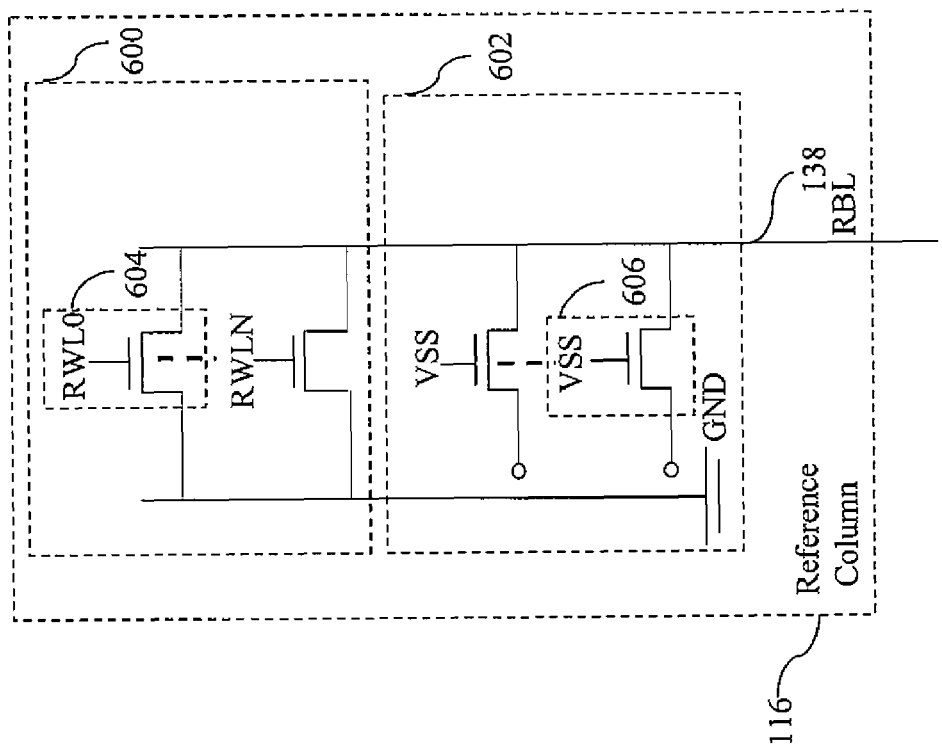
FIG. 6A is a circuit diagram of a reference column, in accordance with an embodiment of the present invention.

Referring now to FIG. 6A, a circuit diagram of the reference column 116 in accordance with an embodiment of the present invention is shown.

The reference column 116 includes the RBL 138, a set of programmable pull-down bit cells 600 and a set of loading bit cells 602. The set of programmable pull-down bit cells 600 includes programmable pull-down bit cells such as a programmable pull-down bit cell 604. Similarly, the set of loading bit cells 602 includes loading bit cells such as a loading bit cell 606.

Gate terminals of the programmable pull-down bit cells 600 are connected to RWLs 136 such as RWL0-RWLN. Drain terminals of the programmable pull-down bit cells 600 are connected to the RBL 138. The number of programmable pull-down bit cells 600 is the same as the number of bit cells in the bit line column 104. The RBL 138 has the same loading as the bit line 122 and is used to track the bit line 122.

Gate terminals of the loading bit cells 602 are connected to $V_{SS}$. Drain terminals of the loading bit cells 602 are connected to the RBL 138. The loading bit cells 602 track the RC variations in the RBL 138.

Source terminals of both the programmable pull-down bit cells 600 and the loading bit cells 602 are connected to a source line. For storing a logic value 0, the source line is connected to a ground voltage. Hence, the source terminals are connected to the ground voltage. For storing a logic value 1, the source terminals of both the programmable pull-down bit cells 600 and the loading bit cells 602 are open circuited.

In one embodiment, the number of the programmable pull-down bit cells 600 varies based on the number of bit cells to be read in the bit line column 104, i.e., the loading of the bit line column 104. In another embodiment, the programmable pull-down bit cells 600 are located below the loading bit cells 602.

Referring now to FIG. 6B, a block diagram of a decoding circuit 608 in accordance with an embodiment of the present invention is shown.

The decoding circuit 608, referred to as a Valdec, receives the signal on the RWL line 136 and control signals, such as signals D4-DN. In one embodiment, the signals D4-DN are generated by the control circuit 110. The Valdec 608 generates signals on output lines such as RWL0-RWLN. The output signals are provided to the set of programmable pull-down bit cells 600. The number of output signals generated by the Valdec 608 is based on the number of bit cells that are required to be read in the bit line column 104.

In one embodiment, the Valdec 608 is located at the top of the reference column 116 and in another embodiment, the Valdec 608 is located at the bottom of the ROM array 102. The position of the Valdec 608 is based on the scalability of the design of the ROM 100.

Figure 7:
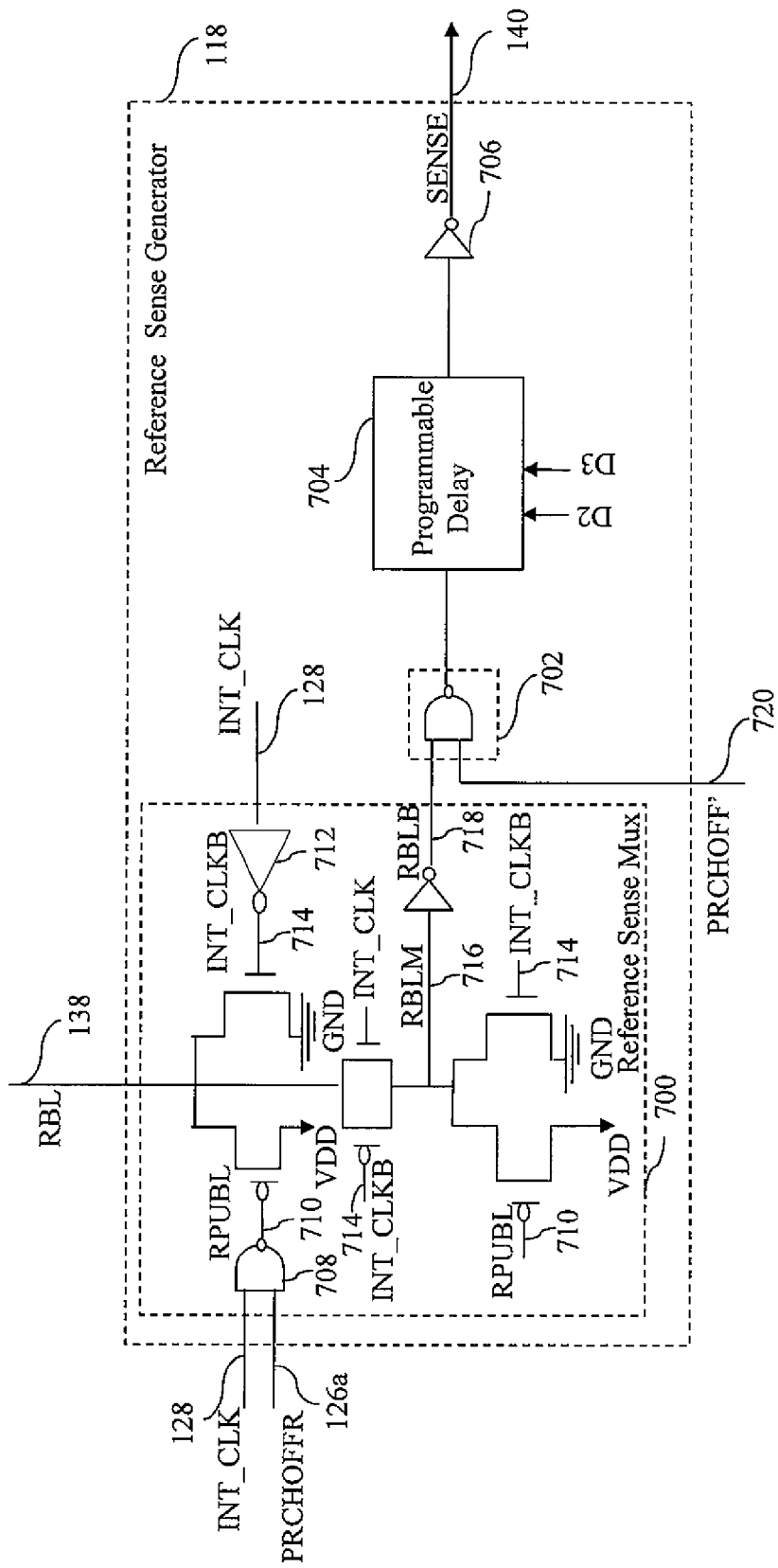
FIG. 7 is a circuit diagram of a reference sense generator, in accordance with an embodiment of the present invention.

Referring now to FIG. 7, a circuit diagram of the reference sense generator 118 in accordance with an embodiment of the present invention is shown.

The reference sense generator 118 includes a reference sense mux 700, a NAND gate 702, a programmable delay circuit 704 and a sense amplifier 706. The reference mux 700 includes a NAND gate 708, a Reference PUBL (RPUBL) 710, a NOT gate 712, an INT_CLKB line 714, a Reference Bit Line M (RBLM) 716 and a Reference Bit Line B (RBLB) 718.

The signal on the INT_CLK line 128 and the programmable precharge signal are provided to the NAND gate 708. The NAND gate 708 outputs a signal on the RPUBL 710. The signal on the RPUBL 710 is inverted by a first pair of transistors and used to generate a signal on the RBLM 716. The signal on the RBLM 716 is provided to a NOT gate, which generates a signal on the RBLB line 718. The signal on the RBLB line 718 and the signal on a PRCHOFF' line 720 are provided to the NAND gate 702. In one embodiment, the signal on the PRCHOFF' line 720 is an inverted derivative of the programmable precharge signal. The NAND gate 702 outputs a signal to the programmable delay circuit 704. The programmable delay circuit 704 also receives control signals D2-D3 at its input terminals. The programmable delay circuit 704 outputs a signal to the sense amplifier 706, which generates the programmable sense signal. The control signals D2 and D3 provide a programmable delay apart from the logic delay provided by the logic gates of the reference sense generator 118. The programmable sense signal is used for placing the data read from the bit cell on the I/O lines 120a and 120b. The reference column 116 and the reference sense generator 118 ensure that read tracking is provided.

During precharge, both the signal on the INT_CLK line 128 and the programmable precharge signal are at logic 1. Hence, the signal on the RPUBL 710 is at logic 0 and the signal on the RBLM line 716 is at logic 1. Further, both the signals on the RBLB 718 and the signal on the PRCHOFF' line 720 are at logic 0. Hence, the output of the NAND gate 702 is at logic 1. In one embodiment, the control signals D2-D3 are programmed such that the programmable sense signal is generated only after the precharging of the bit line 122 is complete. Hence, gating of the signal on the PRCHOFF' line 720 with the output of the reference sense mux 700 ensures that sensing of the bit line 122 occurs after completion of the precharging. Thus for a read operation, active power for the read 0 operation is reduced, i.e., no unnecessary toggling of the I/O lines 120a and 120b occurs. The bit line 122 is discharged back to $V_{SS}$ when the read cycle is complete.

In one embodiment, the control signals D2, D3 on the INT_CLK line 128, and signals on the INT_CLKB line 714 are generated by the control circuit 110. In another embodiment, the control signals D2 and D3 provide an additional delay ranging between 140 ps to 690 ps.

Figure 8:
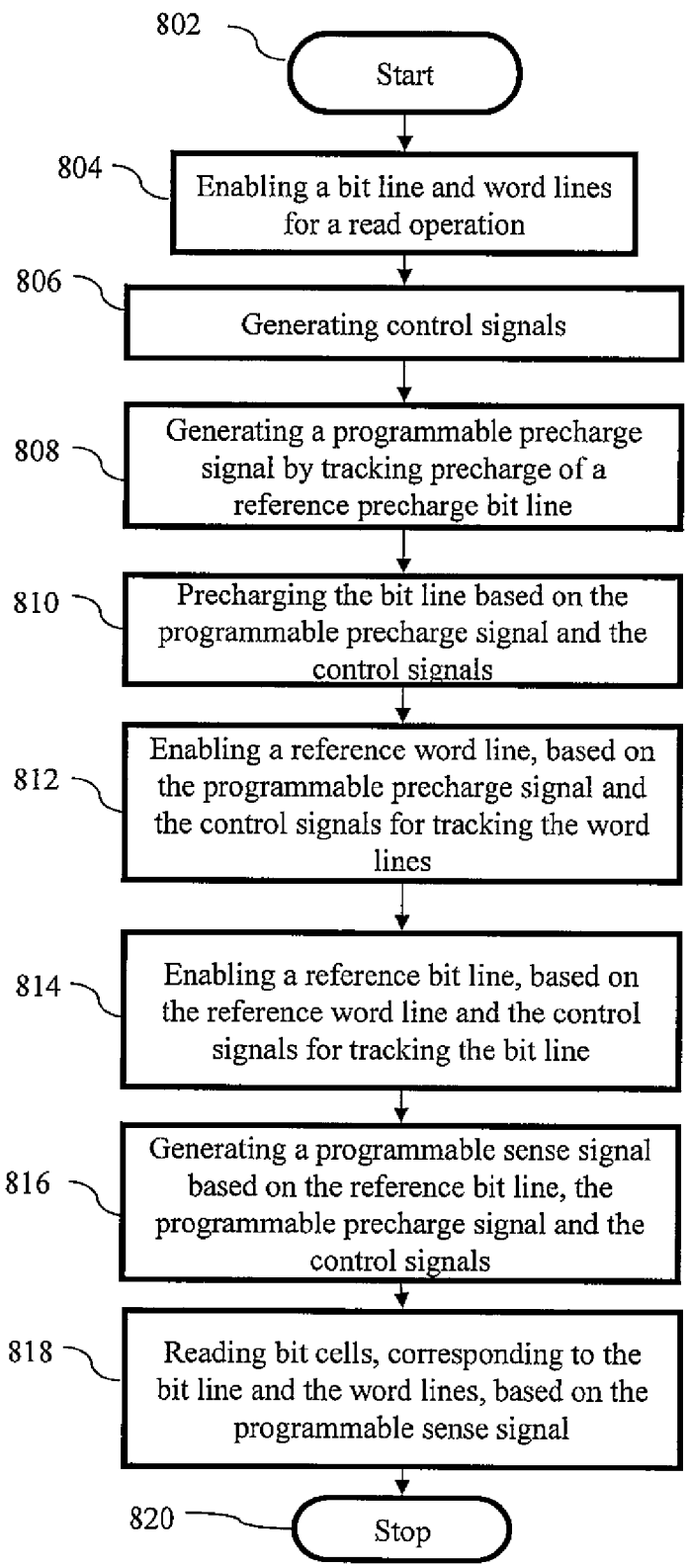
FIG. 8 is a flow chart illustrating a method for performing a read operation in a low power ROM, in accordance with an embodiment of the present invention.

Referring now to FIG. 8, a flow chart of a method for performing a read operation on the ROM 100 in accordance with an embodiment of the present invention is shown. The method starts at step 802, where the ROM 100 is enabled for a read operation.

At step 804, the bit line 122 and a word line are enabled for a read operation. The bit line 122 and the word line are enabled by the ADR line 402 and the Xdec 112.

At step 806, the control circuit 110 generates control signals. Examples of the control signals include the signal on the INT_CLK line 128, the signal on the INT_CLKB line 714, and the control signals D0-DN.

At step 808, the precharge tracker 106 generates the programmable precharge signal. The programmable precharge signal is generated by tracking precharge of the RPBL 124.

At step 810, the bit line 122 is precharged based on the programmable precharge signal, the control signals D0-D1, and the signal on the INT_CLK line 128. The bit line 122 is precharged to the desired voltage level of $V_{DD}$. When the precharging of the bit line 122 is complete, the signal on the WCLK line 132 is generated. The signal on the WCLK line 132 is generated based on both the programmable precharge signal and the signal on the INT_CLK line 128. The signal on the WCLK line 132 is used to generate the signals on the WLR line 130a and the WLL line 130b.

At step 812, the RWL generator 134 and the reference array 114 enable the RWL 136. Enabling of the RWL 136 is based on the generation of the signal on the WCLK line 132, which in turn depends on the programmable precharge signal, and the signal on the INT_CLK line 128. Hence, the generation of the signal on the WCLK line 132 is based on generation of the control signals and the programmable precharge signal. The RWL 136 tracks the word line that was enabled at step 804 and the Valdec 608 enables the RWL0-RWLN signals using the RWL 136.

At step 814, the reference column 116 enables the RBL 138. The RWL0-RWLN signals are provided to the reference column 116 to control loading of the RBL 138. Hence, the loading is controlled by the RWL 136. The loading of the RBL 138 is also controlled by the control signals D4-DN. The RBL 138 tracks the bit line 122.

At step 816, the reference sense generator 118 generates the programmable sense signal. The programmable sense signal is generated based on the RBL 138, the programmable precharge signal, the signal on the INT_CLK line 128, the signal on the PRCHOFF' line 720 and the control signals D2-D3. Further, the programmable sense signal is generated after the precharging is complete. The programmable sense signal is provided to a control logic circuit associated with the RBL 138 for performing the read operation.

At step 818, a bit cell corresponding to the bit line 122 is read. The read data is placed on the I/O lines 120a and 120b.

The method for reading the ROM 100 is then complete at step 820.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A Read Only Memory (ROM), comprising:
   a ROM array including a plurality of bit line columns connected to a plurality of bit lines, each of the plurality of bit line columns comprising a plurality of bit cells, wherein gate terminals of each of the plurality of bit cells are connected to a plurality of word lines;
   an address decoder for enabling at least one of the bit lines and at least one of the word lines for a read operation;
   a control circuit for generating at least one control signal;
   a precharge tracker for generating a programmable precharge signal by tracking a precharge of a reference precharge bit line;
   a precharge circuit, connected to the enabled bit line, for precharging the enabled bit line based on at least one of the programmable precharge signal and the at least one control signal;
   a reference word line that is enabled with a reference array based on at least one of the programmable precharge signal and the at least one control signal, the reference word line tracking the at least one enabled word line;
   a reference bit line that is enabled using a reference column based on at least one of the reference word line and the at least one control signal, the reference bit line tracking the enabled bit line; and
   a reference sense generator for generating a programmable sense signal based on at least one of the reference bit line, the programmable precharge signal and the at least one control signal, wherein the programmable sense signal is provided to a control logic circuit associated with the bit line for reading at least one bit cell corresponding to the enabled bit line and the at least one enabled word line.

2. The ROM of claim 1, further comprising a row decoder circuit that enables the at least one of the word lines for the read operation.

3. The ROM of claim 1, wherein the precharge tracker comprises at least one of a Reference Precharge Bit Line (RPBL) column, a reference precharge circuit, an inverter and a programmable delay circuit.

4. The ROM of claim 3, wherein the RPBL column comprises the reference precharge bit line, the reference precharge bit line having identical loading as the enabled bit line.

5. The ROM of claim 3, wherein the RPBL column comprises a plurality of reference bit cells, the plurality of reference bit cells being equal in number to the number of bit cells connected to the enabled bit line.

6. The ROM of claim 1, wherein the reference column comprises a plurality of programmable pull-down bit cells, the plurality of programmable pull-down bit cells being connected to the reference bit line.

7. The ROM of claim 6, wherein the number of the plurality of programmable pull-down bit cells is equal in number to the number of bit cells connected to the enabled bit line.

8. The ROM of claim 6, wherein the reference column comprises a programmable decoding circuit that enables at least one of the plurality of programmable pull-down bit cells based on gating of the reference word line with the at least one control signal.

9. The ROM of claim 1, wherein the reference sense generator comprises at least one of a logic NAND gate, a reference sense mux, and a programmable delay circuit.

10. The ROM of claim 1, wherein the programmable sense signal is generated after the precharging of the enabled bit line is complete.

11. A method for reading a ROM array, the ROM array comprising a plurality of bit line columns connected to a plurality of bit lines, each of the plurality of bit line columns comprising a plurality of bit cells, wherein gate terminals of each of the plurality of bit cells are connected to a plurality of word lines, the method comprising:
   enabling one of the plurality of bit lines and at least one of the word lines for a read operation;
   generating at least one control signal;
   generating a programmable precharge signal by tracking a precharge of a reference precharge bit line;
   precharging the enabled bit line based on at least one of the programmable precharge signal and the at least one control signal;
   enabling a reference word line, based on at least one of the programmable precharge signal and the at least one control signal, the reference word line tracking the at least one enabled word line;
   enabling a reference bit line based on at least one of the reference word line and the at least one control signal, the reference bit line tracking the enabled bit line;
   generating a programmable sense signal based on at least one of the reference bit line, the programmable precharge signal and the at least one control signal; and
   reading at least one bit cell corresponding to the enabled bit line and the at least one enabled word line based on the programmable sense signal.

12. The method for reading a ROM array of claim 11, wherein the at least one of the word lines is enabled using a row decoder circuit.

13. The method for reading a ROM array of claim 11, wherein generating the programmable precharge signal comprises using at least one of a Reference Precharge Bit Line (RPBL) column, a reference precharge circuit, an inverter and a programmable delay circuit.

14. The method for reading a ROM array of claim 13, wherein the RPBL column comprises the reference precharge bit line, the reference precharge bit line having identical loading as the enabled bit line.

15. The method for reading a ROM array of claim 13, wherein the RPBL column comprises a plurality of reference bit cells, the plurality of reference bit cells being equal in number to the number of bit cells connected to the enabled bit line.

16. The method for reading a ROM array of claim 11, wherein enabling the reference bit line comprises using a plurality of programmable pull-down bit cells, the plurality of pull-down bit cells being connected to the reference bit line.

17. The method for reading a ROM array of claim 16, wherein enabling the reference bit line comprises using a programmable decoding circuit that enables at least one of the plurality of programmable pull-down bit cells based on gating of the reference word line with the at least one control signal.

18. The method for reading a ROM array of claim 11, wherein generating the programmable sense signal comprises using at least one of a logic NAND gate, a reference sense mux, and a programmable delay circuit.

19. The method for reading a ROM array of claim 11, wherein generating the programmable sense signal is performed after the precharging of the enabled bit line is complete.

20. A system for precharging a ROM array, the ROM array comprising a plurality of bit line columns, the plurality of bit line columns being connected to a plurality of bit lines, each of the plurality of bit line columns comprising a plurality of bit cells, wherein gate terminals of each of the plurality of bit cells are connected to a plurality of word lines, the system comprising:
   an address decoder for enabling at least one of the bit lines and at least one of the word lines for a read operation;
   a control circuit for generating at least one control signal for precharging the ROM array;
   a precharge tracker for generating a programmable precharge signal by tracking precharge of a reference precharge bit line; and
   a precharge circuit, connected to the enabled bit line, for precharging the enabled bit line based on at least one of the programmable precharge signal and the at least one control signal.

* * * * *